United States Patent [19]
Givens

[11] Patent Number: 6,060,385
[45] Date of Patent: May 9, 2000

[54] METHOD OF MAKING AN INTERCONNECT STRUCTURE

[75] Inventor: John H. Givens, Meridian, Id.

[73] Assignee: Micro Technology, Inc.

[21] Appl. No.: 08/801,819

[22] Filed: Feb. 14, 1997

[51] Int. Cl.[7] ...................... H01L 21/4763; H01L 21/311
[52] U.S. Cl. .......................... 438/626; 438/640; 438/645; 438/643; 438/700; 438/952
[58] Field of Search ..................................... 438/643, 700, 438/626, 645, 640, 952

[56] References Cited

U.S. PATENT DOCUMENTS

| | | |
|---|---|---|
| 4,920,070 | 4/1990 | Mukai . |
| 5,298,463 | 3/1994 | Sandhu et al. . |
| 5,510,294 | 4/1996 | Dixit et al. . |
| 5,525,542 | 6/1996 | Maniar et al. . |

*Primary Examiner*—John F. Niebling
*Assistant Examiner*—J. Jones

*Attorney, Agent, or Firm*—Workman, Nydegger & Seeley

[57] ABSTRACT

The present invention comprises a metallization method that forms a three-level interconnect in an electrical circuit. The method comprises providing a substrate assembly and depositing thereon a first dielectric layer thereover. A second dielectric layer is then deposited over the first dielectric layer. The second dielectric layer is patterned and anisotropically etched to form contact corridors. The second dielectric layer is again patterned and etched to form trenches, some of which are immediately above the contact corridors. An electrically conductive material is deposited to fill the contact corridors and trenches, and to leave a portion of the electrically conductive material above the second dielectric layer and directly above both the contact corridors and the trenches. The deposition forms a unitary three-level interconnect having a contiguous trench below a contact corridor below a metal line, where the metal line is above the second dielectric layer. An optional antireflective coating can be deposited to assist in filling the trenches and contact corridor. Finally, patterning and etching of the electrically conductive material above the second dielectric layer forms metal lines for the electrical circuit.

36 Claims, 3 Drawing Sheets

METHOD OF MAKING AN INTERCONNECT STRUCTURE

BACKGROUND OF THE INVENTION

1. The Field of the Invention

The present invention relates to metallization methods in the manufacture of microelectronic semiconductor devices. More particularly the present invention relates to methods of making microelectronic semiconductor devices having up to three-level interconnect structures of conductive materials in which a single deposition process is used.

2. The Relevant Technology

After fabrication of microelectronic devices in and upon semi-conductive substrate assemblies, metallization of the circuitry is required to place the microelectronic devices in electrical communication one to another according to design. Prior art designs called for contacts, trenches, and superficial wires for metallization. These designs may require three or more separate depositions of conductive material in order to complete metallization of the design. Each layer of conductive material was made by the steps of depositing the conductive layer, depositing and patterning a photoresist or equivalent, and etching the conductive layer.

With multiple depositions of conductive material, usually composed of a metal or a doped polysilicon, various technical challenges and device characteristics arise. As semiconductor manufacturing advances from very large scale integration (VLSI) to ultra-large scale integration (ULSI), the devices on a semiconductor wafer shrink to sub-micron dimensions, and the circuit density increases to several million transistors per die. In order to accomplish the required high device packing density, progressively smaller feature sizes have been required. These reduced feature sizes include the width and spacing of interconnecting lines in the service geometry thereof, such as comers and edges.

As features become smaller, a process flow that requires multiple depositions tends to narrow the process window for error in misalignments. As such, a single misalignment in metallization can cause a significant yield reduction.

One technical obstacle in metallization line formation is depth-of-field limits in photolithography. Formation of metallization lines follows contact plug filling by deposition and patterning of a deposited metallization material. When a contact plug is formed in a contact hole, the metallization material that fills the contact hole may have an irregular surface immeadiately below the contact hole due to the filling thereof. The irregular surface of the metallization material has depth-of-field focusing problems due to a rough topography thereof. The rough topography can cause photolithographic steps to produce irregular metallization line widths, which in turn lead to unpredictable resistances along the metallization lines and unreliable device speeds.

Another technical obstacle is the inherent resistance in metal-to-metal interfaces between contacts and trenches, contacts and metallization lines, and trenches and metallization lines. This obstacle arises when disparate metals make up the contact and metallization line, or even when metals of the same composition are poorly interfaced. The process of forming contacts in semiconductors and the subsequent wiring of those contacts to form a completed integrated circuit conventionally comprises two steps.

The first step comprises forming an aluminum or tungsten plug within a contact hole by such methods as, for example, cold or hot deposition, cold-slow, or hot-fast force filling, or metal reflow of the contact hole. There are other methods of hole filling with aluminum known in the art. Tungsten plug hole filling comprises depostion of selected adhesional and barrier liner layers, followed by CVD of tungsten. The contact hole is usually defined within an insulation layer. Next, a planarizing step leaves the titanium or tungsten plug electrically isolated in the contact hole. The second deposition step comprises forming a metallization line over the plug, where the metallization line is usually composed of a material different from that of the plug.

The plug interface with the metallization line is problematic to electrical conduction because completely connected interface areas are difficult to achieve, particularly in dissimilar metals. Because resistance in electrical conduction is a function of cross-sectional area through the conductive body, a less than completely connected interface between contact or trench and metallization line causes a higher resistance than a completely connected interface. In addition to incomplete interface connections, filling a contact hole with aluminum requires high temperatures and pressures that may cause large or irregular grain structures to grow. Large or irregular grain structures resist flow and etchback, and do not conduct current as well as fine-grained structures.

Still other technical obstacles are electromigration and metal creep. These involve the transport of metal atoms along the direction of electron flow in the conductive lines, and can lead to failure of the conductive lines. These obstacles are discussed below in turn.

Aluminum-copper electromigration is well established in a structure with an aluminum-copper metallization line interfacing with a titanium or tungsten plug. The phenomenon occurs because copper diffusivity through titanium or tungsten is much lower than copper diffusivity through aluminum. Therefore, the copper is depleted from the area of the titanium or tungsten plug by the current flow, leading to failure at the interface between the titanium or tungsten plug and the aluminum-copper line.

Metal creep, on the other hand, occurs due to differences in the thermal coefficients of expansion between metals, insulators, and silicon materials. Differences in thermal coefficients of expansion can build up stresses in the metal interconnects, which can lead to migration of atoms from one area to another. This migration of atoms forms voids or vacancies in the metal interconnect which cause can an electrical failure.

The problems of cumulative misalignments and of electrical resistance at metal-metal interfaces with its several destructive effects, are to be avoided. What is needed is methods of making multi-level interconnect structures that overcome these problems.

SUMMARY OF THE INVENTION

The present invention comprises a method of forming a three-level interconnect metallization scheme for placing microelectronic devices in a circuit in electrical communication. The inventive method comprises forming a substrate assembly and depositing thereon a first dielectric layer. As used herein, a substrate assembly is one or more layers or structures upon a substrate. A second dielectric layer is then deposited over the first dielectric layer. The second dielectric layer is then patterned and etched twice. The first pattern and etch of the second dielectric layer is an anisotropic etch that forms contact corridors. By way of example, and not by way of limitation, a contact corridor can be a via. The second pattern and etch of the second dielectric layer forms one or more trenches. Preferably, one or more of the trenches will be formed directly above and contiguous to a corresponding contact corridor.

After trench formation, a filling step is performed. During the filling step, an electrically conductive material is deposited into the contact corridors and into the trenches so as to leave excess electrically conductive material above the contact corridors and trenches and upon the second dielectric layer. Additional steps, as a part of the filling step, may be taken to ensure a complete filling of the contact corridors and trenches. The excess electrically conductive material is situated directly above the contact corridors and trenches, thus forming a unitary integrated three-level interconnect.

After the single deposition step, but before the filling step, an optional antireflective coating is deposited to assist in a complete filling of the contact corridors and trenches. An optional planarization of the electrically conductive material can be carried out after the filling step.

After the filling step, either with or without the optional planarization of the electrically conductive material, a second optional antireflective coating is deposited to assist in reducing reflections that hinder subsequent photolithographic processing.

Finally, patterning and etching of the excess electrically conductive material is done. The remaining electrically conductive material in the contact corridors, the trenches, and above the second dielectric layer is formed into a single integral structure, the material of which is supplied to the substrate assembly in a single deposition step. The electrically conductive material in forming single integral structures in combinations of the contact corridors, trenches, and portions above the second dielectric layer each have a substantially constant electrical resistance from the top surface thereof to the bottom surface thereof. The substantially constant electrical resistance is due to the absence of metal-to-metal interfaces therein, which absence is inherent to the single deposition of the electrically conductive material.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to methods of making integrated three-level interconnect structures, two level interconnect structures, and one-level contacts in an integrated circuit, each said method using a single deposition of a conductive material for metallization of the integrated circuit.

Figure 1:
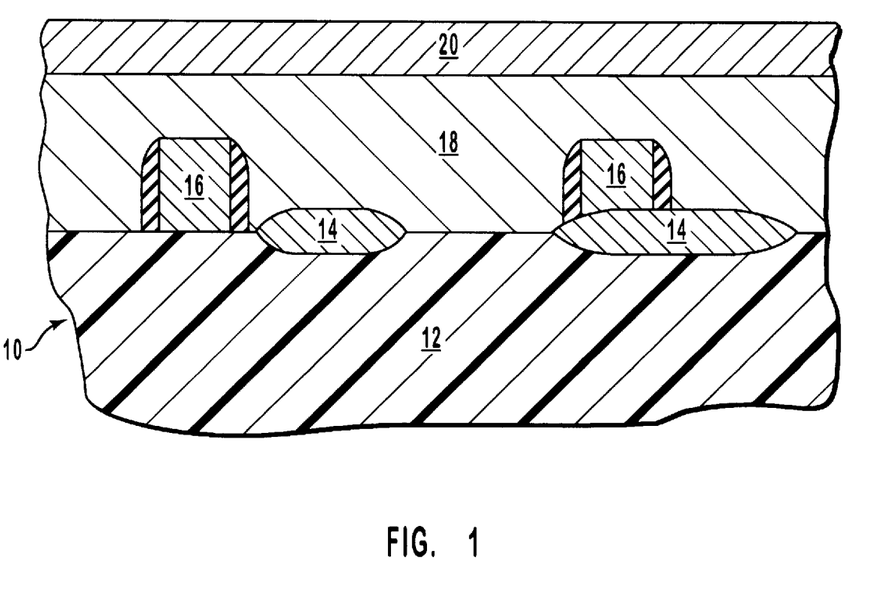
FIG. 1 is a cross-sectional view of a semiconductor device on a substrate assembly during fabrication in which typical structures have been fabricated within and upon a semiconductor substrate assembly.

FIG. 1 illustrates a semiconductor device 10. Semiconductor device 10 comprises, by way non-limiting example, of a substrate assembly 12 with active areas (not shown), oxide regions 14, gate structures 16, a first dielectric layer 18, and a second dielectric layer 20. Other structures, although not illustrated in FIG. 1, could also be a part of semiconductor device 10, including stacked or trench capacitors, as well as other structures.

The inventive method comprises depositing first dielectric layer 18 as shown in FIG. 1. To prevent silicon contamination, first dielectric layer 18 can optionally be composed of a material known to be a silicon impurity getterer such as a doped glass or the like.

If needed, first dielectric layer 18 can be planarized following the deposition thereof. Planarization techniques include chemcial-mechanical planarization (CMP), mechanical planarization (MP), dry etchback, other isotropic etching, reflow, and the like depending upon the nature of first dielectric layer 18. The purpose of such a planarizing step is to provide a relatively flat surface upon which second dielectric layer 20 will be formed. First and second dielectric layers 18, 20 will preferably have different compositions so as to allow the patterning of second dielectric layer 20 with selective etching of first dielectric layer 18, as is described below.

Planarization, although often a necessary step, may be omitted for either or both the first and the second dielectric layers after the deposition thereof. Omission of a planarizing step is possible where the topography of substrate assembly 12 so permits, or where as-deposited first and/or dielectric layers 18, 20 are sufficiently fluid so as to not require a planarization step.

After the deposition and optional planarizing of first dielectric layer 18, second dielectric layer 20 is deposited and may also be optionally planarized if needs be. Deposition of second dielectric layer 20 can be a deposition process that includes silicon dioxide formed by tetraethyl ortho silicate (TEOS), nitride, boron-phosphorus silicate glass (BPSG), and the like according to the specific application.

Figure 2:
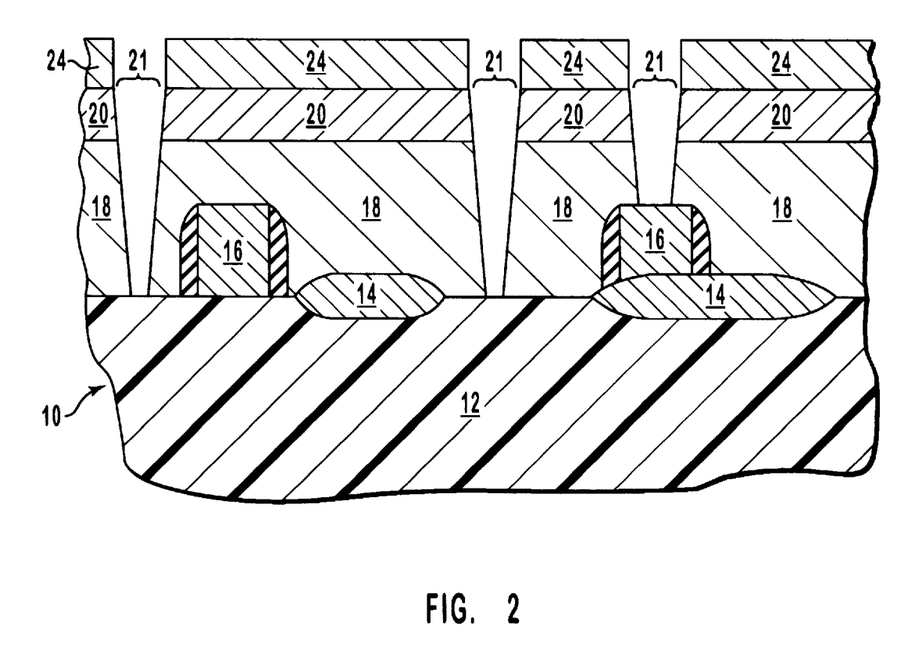
FIG. 2 is a cross-sectional view of the semiconductor device as seen in FIG. 1 and illustrates contact hole fabrication.

Second dielectric layer 20 is then patterned with a first mask 24 and anisotropically etched to form contact corridors 21 which extend through first and second dielectric layers, 18, 20. Contact corridors 21 are illustrated in FIG. 2. Depending upon the application, contact corridors 21 can be used to expose an active area (not shown) of substrate assembly 12, the top of gate structure 16, and regions between the bottom of contact corridors 21 and substrate assembly 12.

Figure 3:
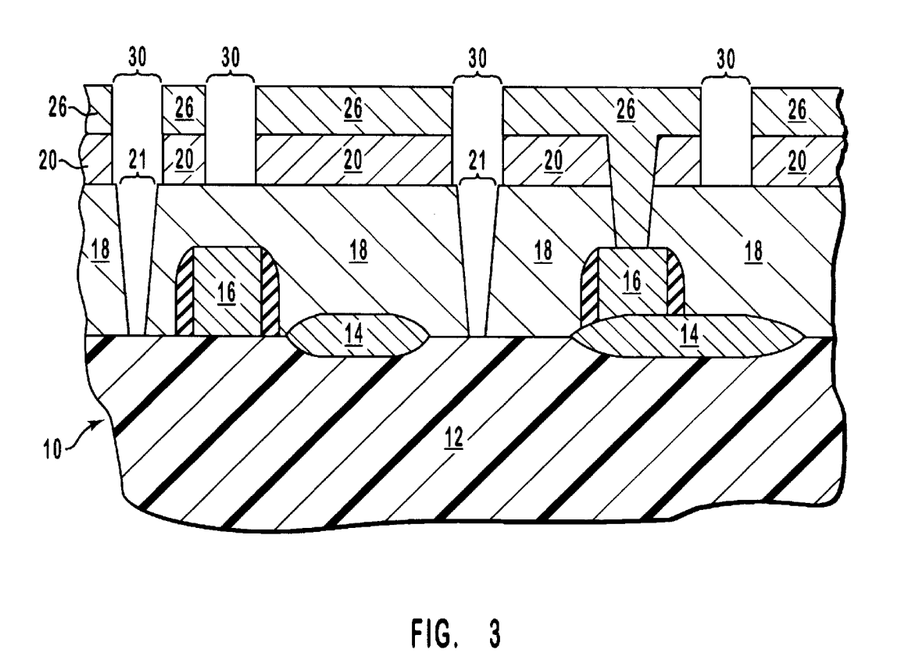
FIG. 3 is a cross-sectional view of the semiconductor device as seen in FIG. 2 and illustrates trench formation in an upper dielectric layer of the semiconductor device.

Following the formation of contact corridors 21, trenches 30 are formed. To form trenches 30, a second mask 26 is use to pattern second dielectric layer 20. Second mask 26 is designed to situate one or more trenches 30 above one or more contact corridors 21, and to situate one or more trenches 30 above first dielectric layer 18. FIG. 3 illustrates the result of an etch with the pattern from second mask 26, which result includes both trenches 30 and contact corridors 21.

In forming trenches 30, the etch recipe used in the etch step can be selective to first dielectric layer 18 and substantially unselective to second dielectric layer 20. Alternatively, it may be desireable to provide a etch recipe that etches first dielectric layer 18 faster so as to reshape contact corridors 21, if so desired. As such, applications are contemplated in which the second etch step has an etch recipe that is partially selective to first dielectric layer 18 and less selective to second dielectric layer 20. As such, trenches 30 are formed, while contact corridors 21 are changed as to the dimensions from the first etch step described above.

Figure 4:
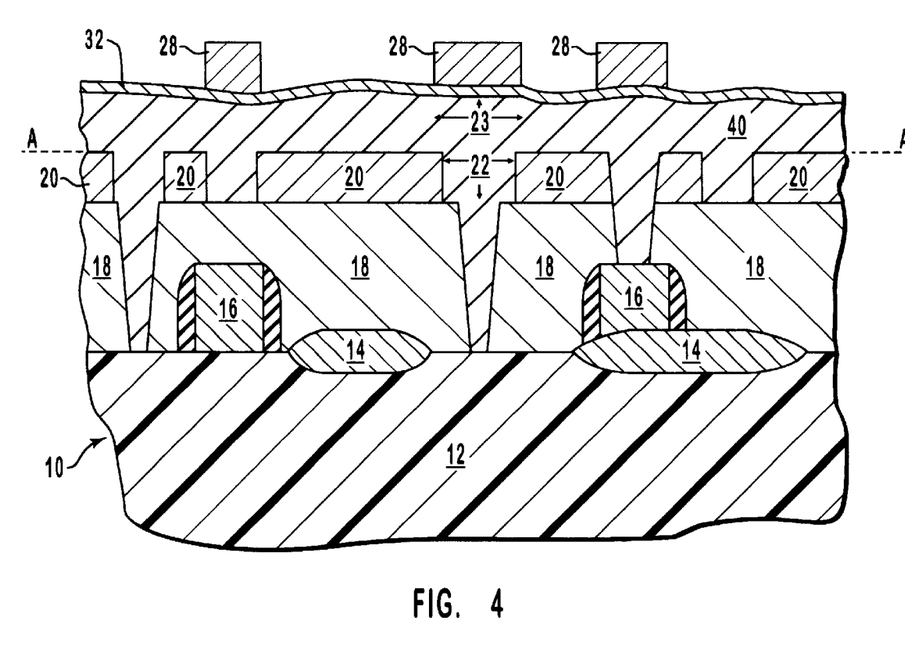
FIG. 4 is a cross-sectional view of the semiconductor device as seen in FIG. 3 and illustrates formation of a metallization layer.

After trenches 30 are formed, first and second masks 24, 26 are stripped, and an electrically conductive material 40 is deposited as shown in FIG. 4. Electrically conductive material 40 can be composed of doped polysilicon, aluminum and aluminum alloys of AlCu, AlSi, AlSiCu, AlTi, their combinations, and equivalents. Other aluminum alloys that are contemplated as consistent with the present invention comprise AlAg, AlAu, AlMn, AlGe, AlW, AlCuGe, AlNi, their combinations, and equivalents.

After initial deposition of electrically conductive material 40, an optional antireflective coating 32, illustrated in FIG. 4, is deposited. Antireflective coating 32 is useful as an etching assistant for subsequent patterning and etching of electrically-conductive material 40 to form metal lines therefrom. The antireflective quality of antireflective coating 32 benefits subsequent photolithographic steps in patterning electrically conductive material 40 by reducing image scattering or blurring inherent in the reflective nature of electrically conductive material 40. Antireflective coating 32 is also useful as an energy-absorbing layer which maintains an elevated temperature of electrically conductive material 40 while the same fills voids within trenches 30 and contact corridors 21. Examples of antireflective coatings include organic layers, SiN and equivalents.

Electrically conductive material 40 is deposited within trenches 30 and contact corridors 21 by known deposit methods such as physical vapor deposition (PVD), hot PVD, high density plasma physical vapor deposition (HDPPVD), and chemical vapor deposition (CVD). Complete filling of trenches 30 and of contact corridors 21 may be accomplished by such additional processing, where necessary or desired, as reflow, high pressure fill, their combinations, and the like. As seen in FIG. 4, electrically conductive material 40 has two regions which are generally indicated as an embedded metallization region 22 and a superficial metallization region 23. Embedded metallization region 22 is defined as a portion of electrically-conductive material 40 below an upper surface 19 of second dielectric layer 20. As seen in FIG. 4, embedded metallization region 22 is depicted as being below a line A—A. As such, embedded metallization region 22 is that portion of electrically conductive material 40 that fills trenches 30 and contact corridors 21. Superficial metallization region 23 is defined as that portion of electrically conductive material 40 above the upper surface of second dielectric layer 20. As seen in FIG. 4, superficial metallization region 23 is depicted as being above the line A—A.

Following the deposition of electrically conductive material 40, and optionally filling steps described above, electrically conductive material 40 may then be planarized so as to form a planar surface upon superficial metallization region 23. This optional planarization aids subsequent photolithography processing of electrically conductive material 40 incident to the patterning thereof which is necessary for etching metal lines therefrom. As descibed above, it is desireable to pattern a planar surface so as to prevent the formation of metal lines of varying widths due to improper photolithography. This optional planarization can be followed by a second optional antireflective coating deposition, resulting in a substantially planar layer similar to antireflective coating 32 seen in FIG. 4, which assists as descibed above in improving the accuracy of patterning second dielectric layer 20 during photolithography processing.

Second dielectric layer 20 is patterned with a third mask 28, as seen in illustrated in FIG. 4. An etch of second dielectric layer 20 through third mask 28 forms metal lines having a shape and orientation according to a design for an electrical circuit metallization scheme. A trench-contact structure 25 is formed as an integral combination within contact corridor 21 and trench 30. A wire-trench structure 27 is formed as an integral combination of superficial metallization region 23 and contact corridor 21. A wire-trench-contact structure 29, seen in FIG. 6 is formed as an integral combination of superficial metallization region 23, trench 30, and contact corridor 21. A wire-contact structure 31 is formed as an integral combination of superficial metallization region 23 and contact corridor 21. Finally, a trench structure 33 is illustrated where a portion of superficial metallization region 23 seen in FIG. 4 was removed to result in trench structure 33 seen in FIG. 5. As such, FIG. 5 illustrates the result of the inventive method in which four interconnect structures are depicted.

Figure 5:
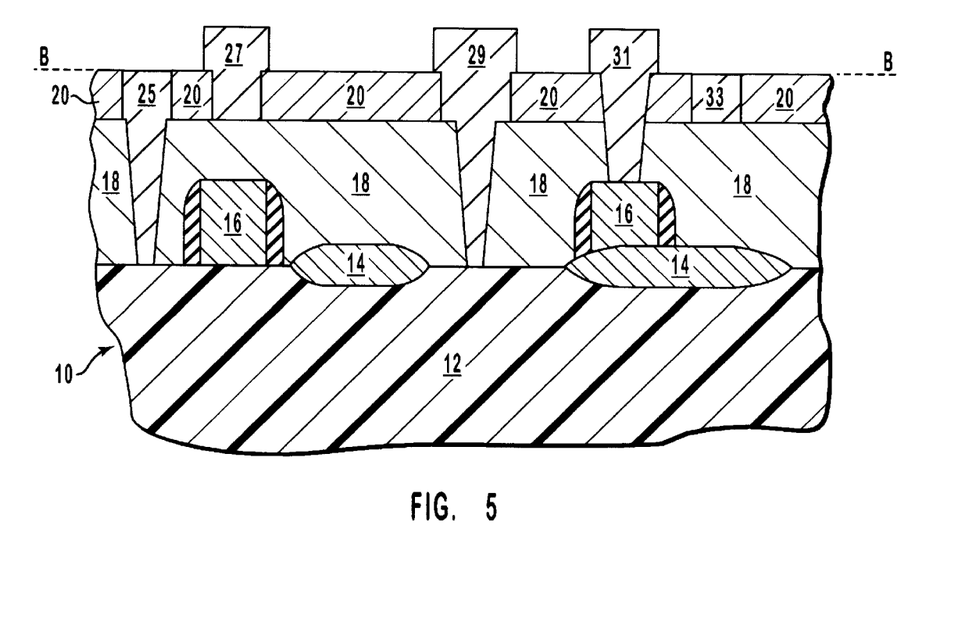
FIG. 5 is a cross-sectional view of the semiconductor device as seen in FIG. 4 and illustrates the metallization thereof, wherein circuitry having several interconnect features has been completed with a single deposition and, patterning of a conductive material.
Figure 6:
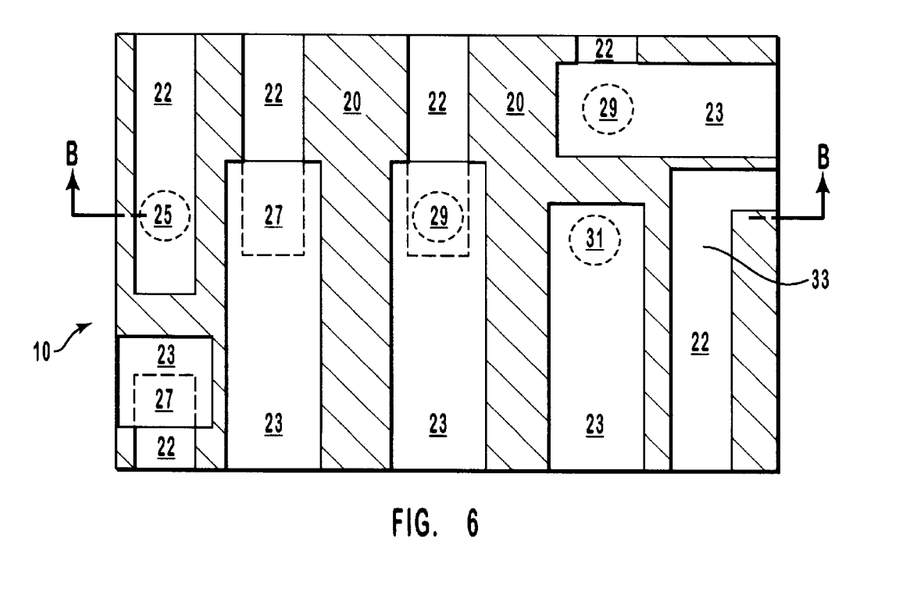
FIG. 6 illustrates a plan view of the semiconductor device of FIG. 5 in which wiring, trenches, and contacts are depicted.

Although semiconductor device 10 is depicted in FIG. 5 as cross-sectional, it is also illustrative to understand the method and structures of the present invention by viewing semiconductor device 10 from the plan view of FIG. 6. In FIG. 6, which is taken along a line B—B within second dielectric layer 20 of FIG. 5, trench-contact structure 25, wire-trench structure 27, wire-trench-contact structure 29, wire-contact structure 31, and trench 33 are illustrated.

As stated above, "metal-to-metal interfaces" are problematic in electrical circuits due to inherent resistance increases therein. Metal-to-metal interfaces are known in multiple depositions required for metallization of circuits having contacts or vias, trenches, and superficial wiring. This metallization includes such structures as bus bars, cables, bonding pads and the like. The inventive method, however, accomplishes metallization of an electrical circuit in a single deposition step. As such, the problem known to multiple level interconnects as "metal-to-metal interfaces" is substantially eliminated. The inventive method also accomplishes a three levels metallization without intervening metal-to-metal interfaces. The substantial elimination of metal-to-metal interfaces in metallization also reduces a tendency for metal migration in that there is an absence of inadequately connected interfacial areas that cause higher temperatures and metal migration. The specific resistance, defined as the resistance per a given cross-sectional area, is substantially uniform throughout single and multiple level interconnect structures.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming an interconnect structure comprising:

forming a first dielectric layer upon a substrate assembly;

forming a second dielectric layer upon said first dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width not less than the second maximum width, wherein:

said first dielectric layer is composed of a material that is dissimilar from a material from which said second dielectric layer is composed; and forming said second recess extending through said first recess and into said second dielectric layer is accomplished by etching said second dielectric layer with an etch recipe that is selective to the material from which said first dielectric layer is composed.

2. A method of forming an interconnect structure as defined in claim 1, wherein forming a first metal layer further comprises:

planarizing said top surface on said first portion of said first metal layer extending from the first trench and above the second dielectric layer; and patterning and etching said top surface on said first portion of said first metal layer.

3. A method of forming an interconnect structure as defined in claim 2, further comprising forming an antireflective coating upon said first metal layer after planarizing said top surface on said first portion of said first metal layer.

4. A method of forming an interconnect structure as defined in claim 1, wherein said first metal layer is composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

5. A method of forming an interconnect structure as defined in claim 1, wherein said first metal layer has a constant electrical resistance from the top surface thereof to the bottom surface thereof.

6. A method of forming an interconnect structure as defined in claim 1, wherein forming said first dielectric layer upon said substrate assembly further comprises planarizing a top surface upon said first dielectric layer, and wherein said second dielectric layer is formed upon said top surface of said first dielectric layer.

7. A method of forming an interconnect structure as defined in claim 1, wherein forming said second dielectric layer upon said first dielectric layer further comprises planarizing a top surface upon said second dielectric layer, and wherein said forming said first metal layer further comprising forming said first metal layer upon said top surface of said second dielectric layer.

8. A method of forming an interconnect structure as defined in claim 1, wherein said first dielectric layer is formed upon a silicon surface of said substrate assembly, said first dielectric layer being composed of a material having a silicon impurity getterer property.

9. A method of forming an interconnect structure as defined in claim 1, wherein the first metal layer is a unitary structure free of metal-to-metal interfaces between the top surface thereof and the bottom surface thereof.

10. A method of forming an interconnect structure as defined in claim 1, wherein said substrate assembly comprises a gate structure, and wherein said first contact corridor terminates at a gate surface upon said gate structure, said bottom surface of said first metal layer is in contact with said gate surface.

11. A method of forming an interconnect structure as defined in claim 1, wherein the bottom surface of said first metal layer is situated upon said substrate assembly.

12. A method of forming an interconnect structure as defined in claim 1, further comprising:

forming a third recess extending through said first dielectric layer and into said second dielectric layer;

forming a fourth recess extending through said second recess and into said second dielectric layer, said fourth recess having a second trench defined by said second dielectric layer and a second contact corridor defined by said first dielectric layer, said second contact corridor having a first maximum width, said second trench having a second maximum width not less than the first maximum width; and forming a second metal layer filling said second contact corridor and said second trench, said second metal layer extending from a top surface not above the second dielectric layer, through said second trench, and terminating at a bottom surface thereof within said second contact corridor, said second metal layer having a constant electrical resistance from the top surface thereof to the bottom surface thereof.

13. A method of forming an interconnect structure as defined in claim 12, wherein the bottom surface of each said first and second metal layers is situated upon said substrate assembly.

14. A method of forming an interconnect structure as defined in claim 12, wherein said first and second metal layers are composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

15. A method of forming an interconnect structure as defined in claim 12, further comprising:

forming a third trench defined by said second dielectric layer and having a second maximum width extending through said second dielectric layer and terminating upon a top surface of said first dielectric layer; and forming a third metal layer extending from a top surface thereof not above the second dielectric layer, through said third trench, and terminating at a bottom surface thereof upon said top surface of said first dielectric layer, said third metal layer filling said third trench, said third metal layer having a constant electrical resistance from the top surface thereof to the bottom surface thereof.

16. A method of forming an interconnect structure comprising:
- depositing a first dielectric layer upon a substrate assembly;
- depositing a second dielectric layer upon said first dielectric layer, wherein said first dielectric layer is substantially composed of a material that is dissimilar from a material from which said second dielectric layer is substantially composed;
- patterning said second dielectric layer with a first mask;
- etching said first and second dielectric layers to form:
    - a first recess extending through said first dielectric layer and into said second dielectric layer;
    - a third recess extending through said first dielectric layer and into said second dielectric layer;
- patterning said second dielectric layer with a second mask;
- etching said second dielectric layer with an etch recipe substantially selective to said material from which said first dielectric layer is substantially composed to form:
    - a second recess extending through said first recess and into said second dielectric layer, said second recess having a first trench defined by said second dielectric layer and a first contact corridor defined by said first dielectric layer, said first contact corridor having a first maximum width, said first trench having a second maximum width substantially not less than the first maximum width; and
    - a fourth recess extending through said second recess and into said second dielectric layer, said fourth recess having a second trench defined by said second dielectric layer and a second contact corridor defined by said first dielectric layer, said second contact corridor having a first maximum width, said second trench having a second maximum width substantially not less than the first maximum width;
- depositing a metal material upon said second dielectric layer and substantially filling said first and second contact corridors, and said first and second trenches;
- patterning said metal material with a third mask;
- etching said metal material with an etch recipe substantially selective to said materials of said first and second dielectric layers to form from said metal material:
    - a first metal layer substantially filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width substantially not less than the second maximum width of said first trench, said first metal layer having a substantially constant electrical resistance from the top surface thereof to the bottom surface thereof; and
    - a second metal layer substantially filling said second contact corridor and said second trench, said second metal layer extending from a top surface substantially not above the second dielectric layer, through said second trench, and terminating at a bottom surface thereof within said second contact corridor, said second metal layer having a substantially constant electrical resistance from the top surface thereof to the bottom surface thereof.

17. A method of forming an interconnect structure comprising:
- depositing a first dielectric layer upon a substrate assembly;
- depositing a second dielectric layer upon said first dielectric layer, wherein said first dielectric layer is substantially composed of a material that is dissimilar from a material from which said second dielectric layer is substantially composed;
- patterning said second dielectric layer with a first mask;
- etching said first and second dielectric layers to form:
    - a first recess extending through said first dielectric layer and into said second dielectric layer;
    - a third recess extending through said first dielectric layer and into said second dielectric layer;
- patterning said second dielectric layer with a second mask;
- etching said second dielectric layer with an etch recipe substantially selective to said material from which said first dielectric layer is substantially composed to form:
    - a second recess extending through said first recess and into said second dielectric layer, said second recess having a first trench defined by said second dielectric layer and a first contact corridor defined by said first dielectric layer, said first contact corridor having a first maximum width, said first trench having a second maximum width substantially not less than the first maximum width;
    - a fourth recess extending through said second recess and into said second dielectric layer, said fourth recess having a second trench defined by said second dielectric layer and a second contact corridor defined by said first dielectric layer, said second contact corridor having a first maximum width, said second trench having a second maximum width substantially not less than the first maximum width; and
    - a third trench defined by said second dielectric layer and having a second maximum width extending through said second dielectric layer and terminating upon a top surface of said first dielectric layer;
- depositing a metal material upon said second dielectric layer and substantially filling said first and second contact corridors, and said first, second, and third trenches;
- patterning said metal material with a third mask;
- etching said metal material with an etch recipe substantially selective to said materials of said first and second dielectric layers to form from said metal material:
    - a first metal layer substantially filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width substantially not less than the second maximum width of said first trench, said first metal layer having a substantially constant electrical resistance from the top surface thereof to the bottom surface thereof;
    - a second metal layer substantially filling said second contact corridor and said second trench, said second metal layer extending from a top surface substantially not above the second dielectric layer, through said second trench, and terminating at a bottom surface thereof within said second contact corridor, said second metal layer having a substantially constant electrical resistance from the top surface thereof to the bottom surface thereof; and a third metal layer extending from a top surface thereof substantially not above the second dielectric layer, through said third trench, and terminating at a bottom surface thereof upon said top surface of said first dielectric layer, said third metal layer substantially filling said third trench, said third metal layer having a substantially constant electrical resistance from the top surface thereof to the bottom surface thereof.

18. A method of forming an interconnect structure as defined in claim 17, wherein the first, second, and third metal layer each is a unitary structure free of metal-to-metal interfaces between the top surface thereof and the bottom surface thereof.

19. A method of forming an interconnect structure as defined in claim 17, wherein providing a substrate assembly further comprises forming a gate structure situated on said substrate assembly, wherein said first contact corridor terminates at a gate surface upon said gate structure, said bottom surface of said first metal layer being in contact with said gate surface, and the bottom surface of said second metal layer is situated upon said substrate assembly.

20. A method of forming an interconnect structure as defined in claim 17, wherein said metal material is substantially composed of a material selected from the group consisting of doped polysilicon, W, aluminum alloys, AlCu, AlSi, AlSiCu, AlTi, AlAg, AlAu, AlMn, AlGe, AlW, AlCuGe, AlNi, and their combinations.

21. A method of forming an interconnect structure comprising:

forming a first dielectric layer upon a substrate assembly;

forming a second dielectric layer upon said first dielectric layer;

planarizing a top surface upon said second dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer that is upon said top surface of said second dielectric layer and that fills said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width not less than the second maximum width.

22. The method as defined in claim 21, said first metal layer has a constant electrical resistance from the top surface thereof to the bottom surface thereof.

23. A method of forming an interconnect structure comprising:

forming a first dielectric layer upon a silicon surface of a substrate assembly, said first dielectric layer being composed of a material having a silicon impurity getterer property;

forming a second dielectric layer upon said first dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width not less than the second maximum width.

24. The method as defined in claim 23, said first metal layer has a constant electrical resistance from the top surface thereof to the bottom surface thereof.

25. A method of forming an interconnect structure comprising:

forming a first dielectric layer upon a substrate assembly;

forming a second dielectric layer upon said first dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width not less than the second maximum width, wherein the first metal layer is a unitary structure free of metal-to-metal interfaces between the top surface thereof and the bottom surface thereof.

26. The method as defined in claim 25, said first metal layer has a constant electrical resistance from the top surface thereof to the bottom surface thereof.

27. A method of forming an interconnect structure comprising:

forming a substrate assembly including a gate structure having a gate surface thereon;

forming a first dielectric layer upon a substrate assembly;

forming a second dielectric layer upon said first dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer filling said first contact corridor and said first trench, said first metal layer extending from a top surface above the second dielectric layer through said first trench and terminating at the gate surface upon the gate structure within said first contact corridor, said first metal layer having a first portion thereof extending from the first trench and above the second dielectric layer with a third maximum width not less than the second maximum width.

28. The method as defined in claim 27, said first metal layer has a constant electrical resistance from the top surface thereof to the bottom surface thereof.

29. A method of forming an interconnect structure comprising:

forming a first dielectric layer upon a substrate assembly;

forming a second dielectric layer upon said first dielectric layer;

forming a first recess extending through said second dielectric layer and into said first dielectric layer;

forming a second recess extending through said first recess and into said second dielectric layer, said second recess having a first trench defined by said second dielectric layer and a first contact corridor defined by said first dielectric layer, said first contact corridor having a first maximum width, said first trench having a second maximum width not less than the first maximum width; and forming a first metal layer filling said first contact corridor and said first trench, said first metal layer extending from a top surface above the second dielectric layer through said first trench and terminating at a bottom surface thereof within said first contact corridor, said first metal layer having a first portion thereof extending from the first trench and above the second dielectric layer with a third maximum width not less than the second maximum width;

forming a third recess extending through said second dielectric layer and into said first dielectric layer;

forming a fourth recess extending through said second recess and into said second dielectric layer, said fourth recess having a second trench defined by said second dielectric layer and a second contact corridor defined by said first dielectric layer, said second contact corridor having a first maximum width, said second trench having a second maximum width not less than the first maximum width; and forming a second metal layer filling said second contact corridor and said second trench, said second metal layer extending from a top surface not above the second dielectric layer, through said second trench, and terminating at a bottom surface thereof within said second contact corridor.

30. The method as defined in claim 29, wherein said second metal layer has a constant electrical resistance from the top surface thereof to the bottom surface thereof.

31. A method of forming an interconnect structure in a semiconductor structure that includes a semiconductor substrate having a first field oxide region therein, a gate structure having a top surface and being situated upon the first field oxide region, a first dielectric layer composed of a first material that is situated upon the gate structure and upon the first and second field oxide regions, and a second dielectric layer composed of a second material different than the first material and situated upon a top surface of the first dielectric layer, the method comprising:

forming a plurality of first recesses extending through the second dielectric layer and into the first dielectric layer, at least one of the first recesses terminating:
upon the top surface of the gate structure; and
upon the semiconductor substrate;

forming a plurality of second recesses each extending through the second dielectric layer, wherein at least one of the second recesses terminates:
at the top surface of the first dielectric layer;
upon the semiconductor substrate and extends through one of the first recesses; and filling the first and second recesses with an electrically conductive layer.

32. The method as defined in claim 31, wherein:

the semiconductor structure includes a second field oxide region; and at least one of the first recesses terminates upon the semiconductor substrate between the first and second field oxide regions.

33. The method as defined in claim 31, wherein:

each said second recess has a first trench defined by the second dielectric layer and has a first contact corridor defined by the first dielectric layer;

the first contact corridor has a first maximum width;

the first trench has a second maximum width not less than the first maximum width.

34. The method as defined in claim 33, wherein:

the electrically conductive layer filling fills the first contact corridor and the first trench; and the electrically conductive layer extends from a top surface above the second dielectric layer through the first trench and terminates at a bottom surface thereof within the first contact corridor, the electrically conductive layer having a first portion thereof extending from the first trench and above the second dielectric layer with a third maximum width not less than the second maximum width.

35. The method as defined in claim 31, further comprising dividing the electrically conductive layer into a plurality of separate portions equal to the number of first and second recess, each said portion extending through one of the first and second recesses.

36. The method as defined in claim 35, wherein each said portion of the electrically conductive layer is electrically isolated from other portions above the semiconductor substrate and in contact with the first and second dielectric layers.

* * * * *

UNITED STATES PATENT AND TRADEMARK OFFICE
CERTIFICATE OF CORRECTION

PATENT NO. : 6,060,385
DATED : May 9, 2000
INVENTOR(S) : John H. Givens

It is certified that error appears in the above-identified patent and that said Letters Patent are hereby corrected as shown below:

On the title page, after "Assignee" change "Micro" to --Micron--

Col. 1, ln. 36: after "such as" change "comers" to --corners--

Col. 4, ln. 18: after "way" insert --of--

Col. 4, ln. 19: before "a substrate" delete [of]

Signed and Sealed this

Twenty-second Day of May, 2001

Attest:

NICHOLAS P. GODICI

*Attesting Officer*     Acting Director of the United States Patent and Trademark Office